United States Patent [19]
Chang et al.

[11] Patent Number: 5,656,959
[45] Date of Patent: Aug. 12, 1997

[54] CLOCK SYNTHESIZER DUAL FUNCTION PIN SYSTEM AND METHOD THEREFOR

[75] Inventors: Steve Chang, San Jose; Elie Ayache, Sunnyvale, both of Calif.

[73] Assignee: International Microcircuits, Inc., Milpitas, Calif.

[21] Appl. No.: 562,478

[22] Filed: Nov. 24, 1995

[51] Int. Cl.$^6$ ............................................. H03B 21/00
[52] U.S. Cl. ..................... 327/105; 327/113; 327/156; 327/185
[58] Field of Search ............................. 327/105, 106, 327/107, 113, 114, 155, 156, 172, 185, 291, 295; 326/56; 331/18, 23, 34; 375/373, 375, 376

[56] References Cited

U.S. PATENT DOCUMENTS

| | | | |
|---|---|---|---|
| 4,633,183 | 12/1986 | Heatherington | 327/107 |
| 5,103,120 | 4/1992 | Suzuki et al. | 326/56 |
| 5,115,149 | 5/1992 | Hashimoto | 326/56 |
| 5,132,633 | 7/1992 | Wong et al. | 327/105 |
| 5,233,241 | 8/1993 | Mishimori | 326/56 |
| 5,248,908 | 9/1993 | Kimura | 326/56 |
| 5,294,894 | 3/1994 | Gebara | 331/1 A |
| 5,382,886 | 1/1995 | Mizuide | 327/105 |
| 5,389,897 | 2/1995 | Gebara | 331/1 |
| 5,406,590 | 4/1995 | Miller et al. | 375/376 |
| 5,491,442 | 2/1996 | Mirov et al. | 327/295 |
| 5,555,276 | 9/1996 | Koenck et al. | 375/303 |

*Primary Examiner*—Timothy P. Callahan
*Assistant Examiner*—My-Trang Nu Ton
*Attorney, Agent, or Firm*—Harry M. Weiss; Jeffrey D. Moy; Harry M. Weiss & Associates, P. C.

[57] ABSTRACT

An improved clock synthesizer system and method therefor is described which uses a plurality of dual function pins to apply a frequency selection code while in a first operating mode and to transmit buffered clock signal while in a second operating mode to accomplish required system functions with a reduced overall pin count.

22 Claims, 3 Drawing Sheets

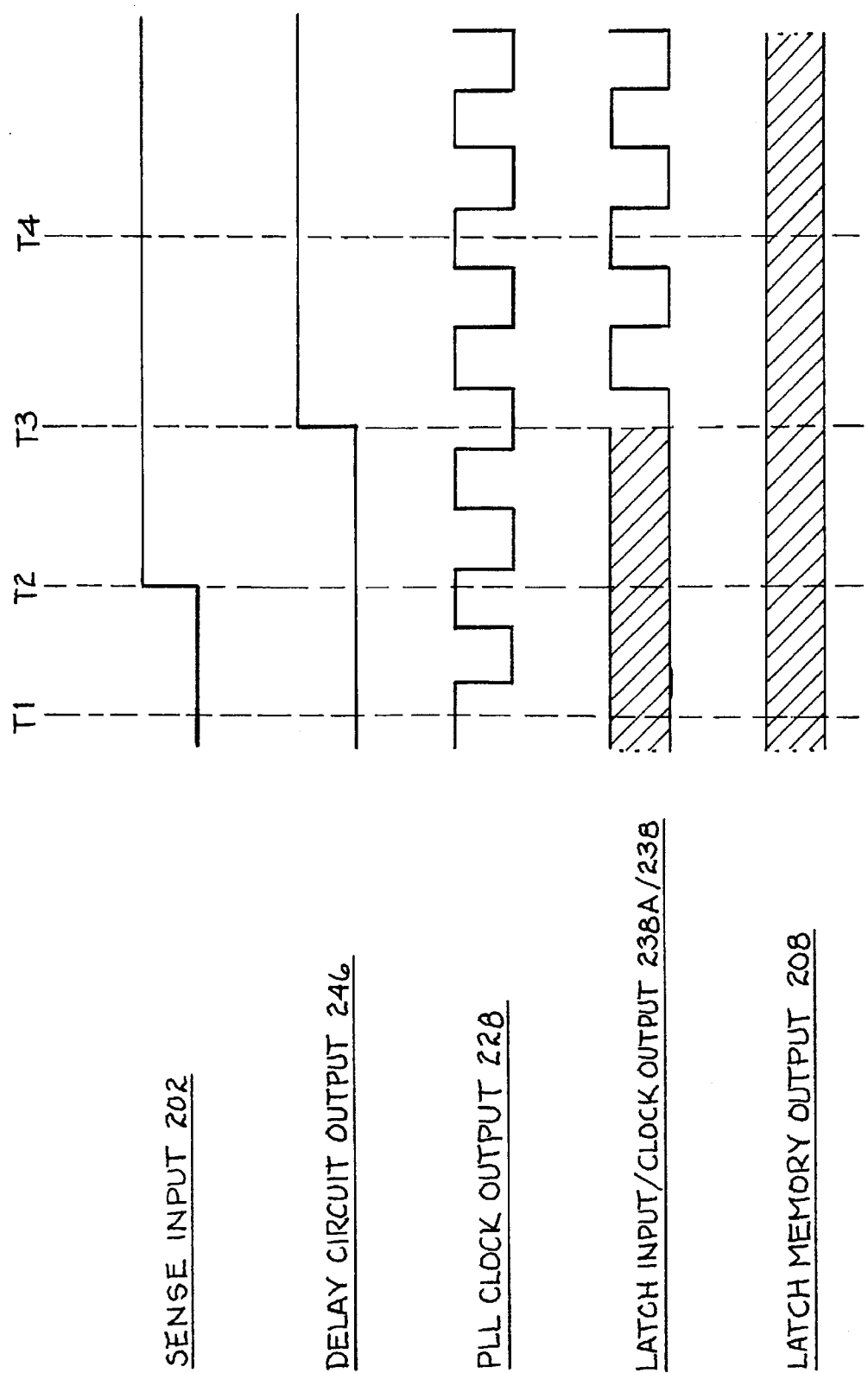

CLOCK SYNTHESIZER DUAL FUNCTION PIN SYSTEM AND METHOD THEREFOR

BACKGROUND OF THE INVENTION

1. Field of the Invention

This invention relates generally to digital logic systems and more specifically to a clock synthesizer system and method therefor which uses a plurality of dual function pins to apply a frequency selection code while in a first operating mode and to transmit a buffered clock signal while in a second operating mode to obtain a reduced pin count for the system.

2. Description of the Prior Art

In effective and cost efficient designs for digital systems and, in particular, in designs based on integrated circuit (IC) microprocessors, it is advantageous to reduce the number of IC package terminals or "pins" to as small a number as possible. This is a desired objective because of several key factors: (1) an IC design which minimizes the number of electrical paths on and off the chip will tend to have a reduced chip area and therefore a lower chip manufacturing cost, (2) a reduced number of electrical paths on and off the IC chip will correspondingly reduce the size and pin count of the package or module used to contain the chip which will reduce the cost of both the package or module itself and the cost of assembling it, and (3) a physically smaller reduced pin-count package will create additional available space and interconnection opportunities on the printed circuit board to which it is mounted. The resulting additional available circuit pins and the associated added layout "real estate" allows the digital systems manufacturer to provide additional system functions without the step function cost increase that would otherwise be required by an additional printed circuit board.

One category of digital sub-systems which often particularly benefits from additional available circuit pins is frequency selectable clock synthesizer systems. These systems are widely used in microprocessor applications where one master system board (often called a "mother board") is reconfigured to adapt to different members of a family of computers. A key element of the reconfiguration is the use of a specific set of electrical conditions on a set of input pins called "frequency select pins". Thus, for example, the electrical conditions established on a set of four frequency select pins at the time a specific motherboard was configured could be used to set one of 16 possible clock frequencies such that the specified frequency is appropriate for the particular microprocessor chip and the other components of that motherboard. A significant disadvantage of this approach is that although a plurality of frequency select pins must be dedicated and available to define the possible required clock frequencies, these pins are only used once at the time the clock synthesizer is configured. Although they are dormant, they are not available for other functions.

Thus a need exists for an improved clock synthesizer design which accomplishes frequency selection in a simple, pin conserving and cost effective manner.

OBJECTS OF THE INVENTION

Accordingly, it is an object of this invention to provide an improved clock synthesizer system.

It is a further object of this invention to provide an improved clock synthesizer system which accomplishes frequency selection with fewer circuit pins.

It is a further object of this invention to provide an improved clock synthesizer system which accomplishes frequency selection with fewer circuit pins through the use of dual function circuit pins.

SUMMARY OF THE INVENTION

According to the foregoing objectives, this invention describes an improved clock synthesizer system and method therefor which uses a plurality of dual function pins to apply a frequency selection code while in a first operating mode and to transmit a buffered clock signal while in a second operating mode to accomplish required system functions with a reduced overall pin count.

BRIEF DESCRIPTION OF THE DRAWINGS

FIG. 3 is a timing diagram showing signal conditions existing within the dual function pin clock synthesizer system of FIG. 2.

DETAILED DESCRIPTION

Figure 1:
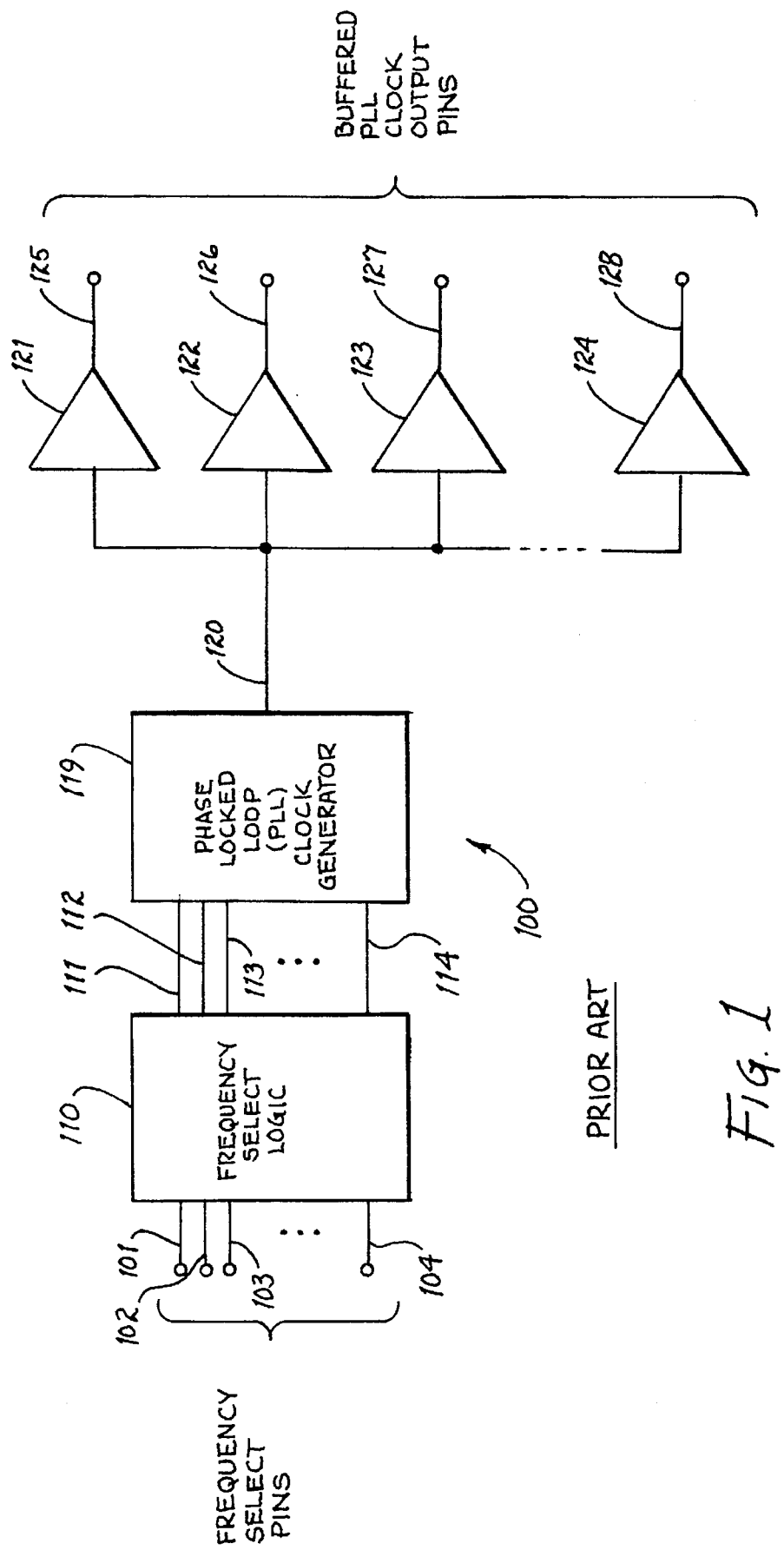
FIG. 1 is a block diagram of a prior art frequency selectable clock synthesizer system.

The block diagram FIG. 1 shows a block diagram of a prior art frequency selectable clock synthesizer system 100. In FIG. 1, frequency selectable clock synthesizer system 100 has as inputs a plurality of frequency select pins 101, 102, 103 and 104 which couple as inputs to frequency select logic module 110. Frequency select logic module 110 has a plurality of outputs 111, 112, 113 and 114 which couple as inputs to phase locked loop (PLL) clock generator module 119. The output of phase locked loop (PLL) block generator module 119 couples via clock output conductor 120 to the inputs of a plurality clock buffers 121, 122, 123, and 124 which produce a plurality of buffered clock outputs 125, 126, 127 and 128. As is well known to persons skilled in the art, prior art frequency selectable clock synthesizer system 100 operates as follows:

At the time that a computer system containing frequency selectable clock synthesizer system 100 is activated by turning it's power supply, a pre-programmed set of digital logic levels ("0's" and "1's") are applied to a plurality of frequency select pins 101, 102, 103 and 104 which couple as inputs to frequency select logic module 110. This pre-programmed set of digital logic levels defines which of the clock frequencies available as options for frequency selectable clock synthesizer system 100 is desired by the user. Frequency select logic module 110 translates the applied pre-programmed set of digital logic levels to produce a set of digital codes on a plurality of outputs 111, 112, 113 and 114 which couple as inputs to phase locked loop (PLL) clock generator module 119. These codes are required by phase locked loop (PLL) clock generator module 119 as control inputs to establish the required operating clock frequency. Phase locked loop (PLL) clock generator module 119 uses well known techniques to combine a frequency reference such as a crystal controlled clock oscillator, frequency dividers, frequency multipliers, temperature compensation circuits and phase locked loops to produce a controlled and stable clock output signal on clock output conductor 120. The clock output signal on clock output conductor 120 couples to the inputs of a plurality clock buffers 121, 122, 123, and 124. Each clock buffer provides amplification which increases the logic drive capability (sometimes called the logical "fan-out") of the clock output. Thus, the plurality of clock buffers 121, 122, 123, and 124 reproduce the system clock signal on a plurality of buffered clock output pins 125, 126, 127 and 128 which are coupled to all the various system destinations which require the synchronization of a clock signal.

As previously mentioned, the disadvantage of prior art frequency selectable clock synthesizer system 100 is that although a plurality of frequency select pins must be dedicated and available to define the possible required clock frequencies, these pins are only used once at the time the clock synthesizer is configured. Although they are dormant, they are not available for other functions. A solution to this problem is provided by the improved dual function pin frequency selectable clock synthesizer system of the present invention which is described below.

Figure 2:
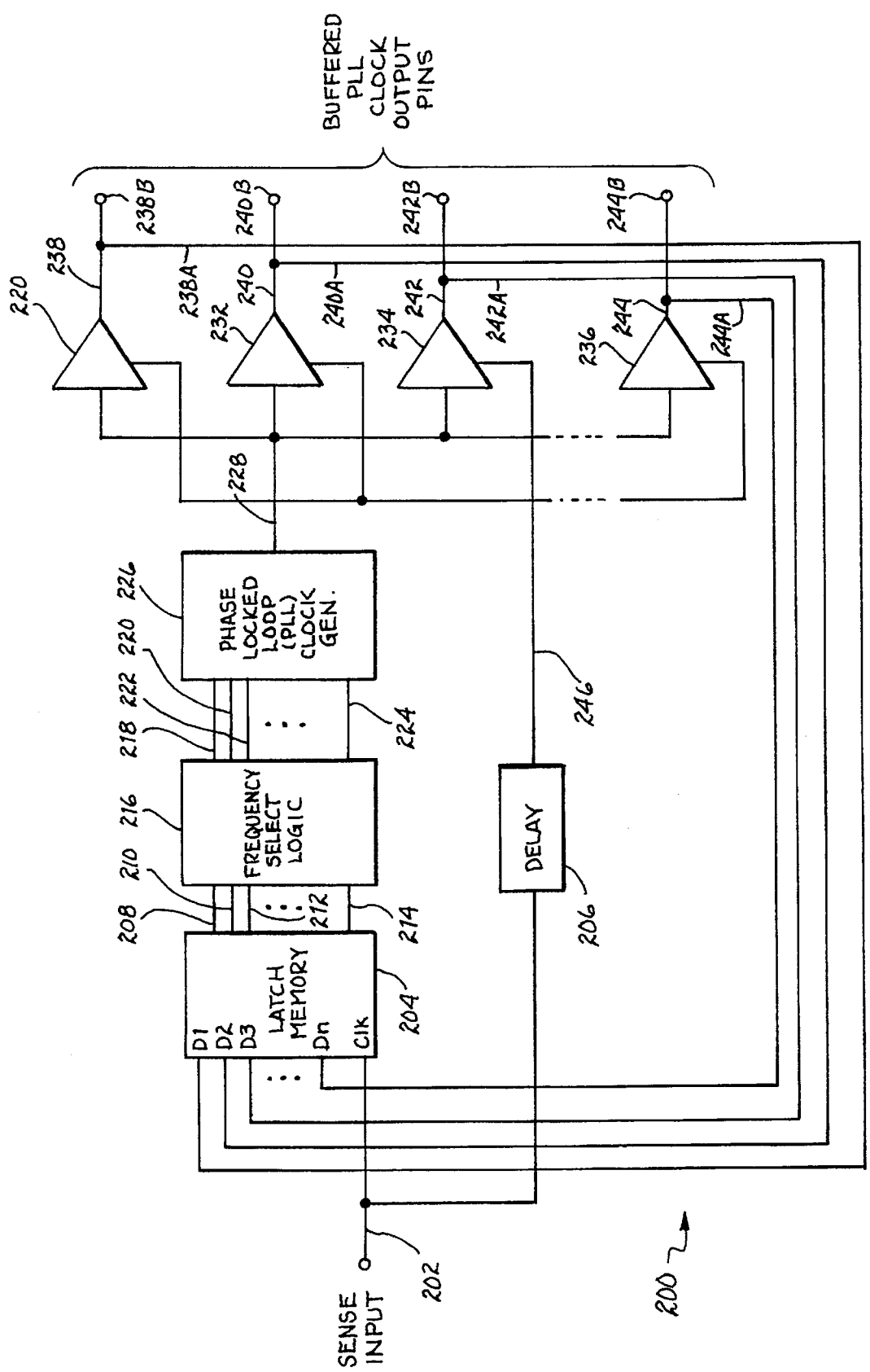
FIG. 2 is a block diagram of dual function pin clock synthesizer system according to the present invention.

FIG. 2 shows a block diagram of dual function pin frequency selectable clock synthesizer system 200 according to the present invention. In FIG. 2, sense input 202 couples to the clock (CLK) input of latch memory module 204 and to the input of delay circuit 206. Latch memory module 204 has a plurality of output conductors 208, 210, 212 and 214 which couple as inputs to frequency select module 216. Frequency select module 216 has a plurality of output conductors 218, 220, 222, and 224 which couple as inputs to phase locked loop (PLL) clock generator module 226. The output of phase locked loop (PLL) clock generator module 226 couples via clock output conductor 228 to the signal inputs of a plurality of tri-state clock buffers 230, 232, 234, and 236 which produce a plurality of buffered clock outputs 238, 240, 242 and 244. Each buffered clock output has an "A" branch and a "B" branch for providing a dual output pin function. Thus, buffered clock output 238 couples to conductor 238A which couples to the D1 input of latch memory 204 and couples to conductor 238B which is one of the plurality of buffered clock output pins of dual function pin frequency selectable clock synthesizer system 200. Similarly, buffered clock output 240 couples to conductor 240A which couples to the D2 input of latch memory 204 and couples to conductor 240B which is another of the plurality of buffered clock output pins of dual function pin frequency selectable clock synthesizer system 200. Similarly, buffered clock output 242 couples to conductor 242A which couples to the D3 input of latch memory 204 and couples to conductor 242B which is another of the plurality of buffered clock output pins of dual function pin frequency selectable clock synthesizer system 200. Similarly, buffered clock output 244 couples to conductor 244A which couples to the Dn input of latch memory 204 and couples to conductor 244B which is another of the plurality of buffered clock output pins of dual function pin frequency selectable clock synthesizer system 200. Finally, the output of delay circuit 206 couples via conductor 246 to the tri-state control inputs of tri-state clock buffers 230, 232, 234, and 236 to complete the system interconnection of dual function pin frequency selectable clock synthesizer system 200.

FIG. 3 is a timing diagram showing signal conditions existing within the dual function pin frequency selectable clock synthesizer system 200 of FIG. 2. With reference to the FIG. 3 timing diagram, the operation of the dual function pin frequency selectable clock synthesizer system 200 of FIG. 2 is as follows:

As previously discussed, when a computer system containing a frequency selectable clock synthesizer is activated, a pre-programmed set of digital logic levels ("0's" and "1's") defines which of the clock frequencies available is desired by the user. For the particular embodiment of the dual function pin frequency selectable clock synthesizer system 200 of FIG. 2, this pre-programmed set of digital logic levels is applied via the plurality of dual function pins 238B, 240B, 242B and 244B which couple respectively as inputs to latch memory 204 via conductors 238A, 240A, 242A and 244A. As shown in FIG. 2, the plurality of dual function pins 238B, 240B, 242B and 244B also couple respectively to the outputs of tri-state clock buffers 230, 232, 234, and 236 via conductors 238, 240, 242 and 244 thereby making each output pin a "dual function pin". As is explained in more detail below, the heart of the present invention is the system operation which allows two separate operating modes to share a single output pin and operate independently without interference. At time T1 (see FIG. 3) each of the latch memory inputs 238A, 240A, 242A and 244A can be in either the logical "0" state or the logical "1" state as defined by the frequency selection code to be applied to the clock synthesizer system 200. In FIG. 3, this possibility of either logical state is shown by the cross-hatched regions of the timing diagram and, at the particular time T1, for the representative latch memory input 238A. At time T1, sense input 202 is in the logical "0" state. The function of sense input 202 is to gate the logic levels present at the D1, D2, D3 and Dn inputs of latch memory module 204 into the memory by making a transition from the "0" to the "1" state. At time T1, delay circuit output 246 which couples to the control inputs of tri-state output buffers 230, 232, 234 and 236, is in the "0" state, thereby forcing these buffers into their high impedance or "off" state. Thus, even though PLL clock output is active at time T1 to apply an input signal to tri-state output buffers 230, 232, 234 and 236, there is no signal passed through to output conductors 238, 240, 242, and 244 since the tri-state output buffers are all "off". Thus the first operating mode of the dual function pins, which is to transmit a frequency selection code to the inputs of latch memory module 204, is accomplished without interference. At time T2, sense input 202 transitions from the "0" to the "1" logical state thereby clocking the frequency selection code present on latch memory inputs 238A, 240A, 242A and 244A into latch memory module 204 via the data inputs D1, D2, D3 and Dn. Because of the signal delay function of delay circuit 206, there is no change in the logical state of delay circuit output 246 and as a result, tri-state output buffers 230, 232, 234 and 236 continue in their high impedance or "off" state. After time T2 but before time T3, the frequency select code contents of latch memory module 204 are present on latch memory output conductors 208, 210, 212 and 214 (FIG. 3 shows representative output 208) which couple as inputs to frequency select logic module 216. Frequency select logic module 216 translates the applied frequency select codes to produce a set of clock control codes on a plurality of outputs 218, 220, 222 and 224 which couple as inputs to phase locked loop (PLL) clock generator module 226. These codes are required by phase locked loop (PLL) clock generator module 226 as control inputs to establish the required operating clock frequency. Phase locked loop (PLL) clock generator module 226 uses well known techniques to combine a frequency reference such as a crystal controlled clock oscillator, frequency dividers, frequency multipliers, temperature compensation circuits and phase locked loops to produce a controlled and stable clock output signal on clock output conductor 228 (see FIG. 3). The clock output signal on clock output conductor 228 couples to the inputs of the plurality of tri-state clock buffers 230, 232, 234, and 236 but there is no change in the output state of these buffers during the time interval between time T2 and time T3 because the buffers are held in the "off" state by delay circuit output 246. At time T3, the delay time introduced by delay circuit 206 has elapsed and delay circuit output 246 transitions from the "0" state to the "1" state. This logical "1" state which couples to the control inputs of tri-state clock buffers 230, 232, 234, and 236 causes each buffer to switch to its low impedance or "on" state so that the clock signal present on PLL clock output conductor 228 is amplified and transmitted to tri-state buffer output conductors 238, 240, 242 and 244 (shown in FIG. 3 for representative conductor 238). As previously noted, because of the dual pin function, each output conductor couples both to a clock output pin and to an input conductor to latch memory module 204. Thus tri-state output conductor 238 couples to clock output pin 238B and to conductor 238A which couples to the D1 data input to latch memory module 204 and so forth. The presence of the clock signal on the data inputs to latch memory module 204 does not affect the operation of clock synthesizer system 200 because after time T2, sense input 202 remains in the logic "1" state so that there is no gating action into latch memory module 204. Thus the second operating mode of the dual function pins, which is to transmit a clock signal without affecting the frequency selection code present in latch memory module 204, is accomplished without interference. The use of dual function pins according to the present invention offers a valuable improvement for frequency selectable clock synthesizer systems since the dedicated package pins required for frequency selection codes in prior art systems are no longer needed. The number of package pins made available for other functions is determined by the number of frequency selection codes used by the clock synthesizer system. For example, if the system made use of 32 codes, the number of package pins made available would be 5 which is the number of binary bits needed to define 32 unique codes.

While the invention has been particularly shown and described with reference to a preferred embodiment thereof, it will be understood by those skilled in the art that changes in form and detail may be made therein without departing from the spirit and the scope of the invention. For example, different implementations of the internal structure of the latch memory module and of the PLL clock generate could be used as long as the dual function resulting from the use of the tri-state buffers was preserved.

We claim:

1. A frequency selectable clock synthesizer system for a computer comprising, in combination:
   clock means for producing a clock signal of a specified frequency defined by a stored frequency selection code; and
   dual function means coupled to a data input of said clock means, coupled to a clock output of said clock means and coupled to a plurality of package pins of said system for making said plurality of package pins function as input pins coupled to said data input in a first operating mode and as output pins coupled to said clock output in a second operating mode.

2. A frequency selectable clock synthesizer system for a computer according to claim 1, said clock means further comprising latch memory means for storing said frequency selection code.

3. A frequency selectable clock synthesizer system for a computer according to claim 2, said clock means further comprising frequency select logic means coupled to said latch memory means for translating said frequency selection code into a clock control code.

4. A frequency selectable clock synthesizer system for a computer according to claim 3, said clock means further comprising clock generator means coupled to said frequency select logic means for producing a clock signal at a frequency determined by said clock control code on a clock output conductor.

5. A frequency selectable clock synthesizer system for a computer according to claim 4, said dual function means further comprising a plurality of tri-state buffers having inputs coupled to said clock output conductor, having outputs coupled to said plurality of package pins, and each having a tri-state control input.

6. A frequency selectable clock synthesizer system for a computer according to claim 5 further comprising control means coupled to the control input of each of said plurality of tri-state buffers for establishing said first operating mode as the high impedance state of said plurality of tri-state buffers and for establishing said second operating mode as the low impedance state of said plurality of tri-state buffers.

7. A frequency selectable clock synthesizer system for a computer according to claim 6, said control means further comprising a delay circuit having an input and output.

8. A frequency selectable clock synthesizer system for a computer according to claim 7 further comprising a sense input conductor coupled to a clock input of said latch memory means and coupled to said input of said delay circuit and a control conductor coupled to said output of said delay circuit and coupled to said tri-state control inputs of said plurality of tri-state buffers.

9. A frequency selectable clock synthesizer system for a computer comprising, in combination:
   latch memory means for storing a frequency selection code;
   frequency select logic means coupled to said latch memory means for translating said frequency selection code into a clock control code;
   clock generator means for producing a clock signal at a frequency determined by said clock control code;
   tri-state buffer means coupled to said clock generator means for transmitting said clock signal to a plurality of dual function pins;
   latch memory input means coupled to said plurality of dual function pins and coupled to said latch memory for providing a frequency select code to be stored when said tri-state buffer means is in a high impedance state; and
   clock output means coupled to said plurality of dual function pins for transmitting said clock signal throughout said computer system when said tri-state buffer means is in a low impedance state.

10. A frequency selectable clock synthesizer system for a computer comprising a dual function pin coupled to the output of a tri-state buffer and to the input of a latch memory storing a frequency code defining a clock frequency of said system, said dual function pin functioning as a clock output pin when said tri-state buffer is in a low impedance state and said dual function pin functioning as a frequency code input pin when said tri-state buffer is in a high impedance state.

11. A frequency selectable clock synthesizer system for a computer comprising, in combination:
   a sense input conductor coupled to the clock input of a latch memory module and to the input of a delay circuit;
   a first plurality of conductors coupled from the outputs of said latch memory to the inputs of a frequency select logic module;
   a second plurality of conductors coupled from the outputs of said frequency select logic module to the inputs of a phase locked loop clock generator module;

a first conductor coupled from the output of said phase locked loop clock generator module to the signal inputs of a plurality of tri-state output buffers;

a second conductor coupled from the output of said delay circuit to the control inputs of said plurality of tri-state output buffers;

a third plurality of conductors coupled from the signal outputs of said plurality of tri-state output buffers to a plurality of dual function pins; and a fourth plurality of conductors coupled from said plurality of dual function pins to a plurality of data inputs of said latch memory module.

12. A method for making a frequency selectable clock synthesizer system for a computer comprising the steps of:
providing clock means for producing a clock signal of a specified frequency defined by a stored frequency selection code; and
providing dual-function means coupled to a data input of said clock means, coupled to a clock output of said clock means and coupled to a plurality of package pins of said system for making said plurality of package pins function as input pins coupled to said data input in a first operating mode and as output pins coupled to said clock output in a second operating mode.

13. A method for making a frequency selectable clock synthesizer system for a computer according to claim 12, said clock means further comprising latch memory means for storing said frequency selection code.

14. A method for making a frequency selectable clock synthesizer system for a computer according to claim 13, said clock means further comprising frequency select logic means coupled to said latch memory means for translating said frequency selection code into a clock control code.

15. A method for making a frequency selectable clock synthesizer system for a computer according to claim 14, said clock means further comprising clock generator means coupled to said frequency select logic means for producing a clock signal at a frequency determined by said clock control code on a clock output conductor.

16. A method for making a frequency selectable clock synthesizer system for a computer according to claim 15, said dual function means further comprising a plurality of tri-state buffers having inputs coupled to said clock output conductor, having outputs coupled to said plurality of package pins, and each having a tri-state control input.

17. A method for making a frequency selectable clock synthesizer system for a computer according to claim 16 further comprising control means coupled to the control input of each of said plurality of tri-state buffers for establishing said first operating mode as the high impedance state of said plurality of tri-state buffers and for establishing said second operating mode as the low impedance state of said plurality of tri-state buffers.

18. A method for making a frequency selectable clock synthesizer system for a computer according to claim 17, said control means further comprising a delay circuit having an input and output.

19. A method for making a frequency selectable clock synthesizer system for a computer according to claim 18 further comprising a sense input conductor coupled to a clock input of said latch memory means and coupled to said input of said delay circuit and a control conductor coupled to said output of said delay circuit and coupled to said tri-state control inputs of said plurality of tri-state buffers.

20. A method for making a frequency selectable clock synthesizer system for a computer comprising the steps of:
providing latch memory means for storing a frequency selection code;
providing frequency select logic means coupled to said latch memory means for translating said frequency selection code into a clock control code;
providing clock generator means for producing a clock signal at a frequency determined by said clock control code;
providing tri-state buffer means coupled to said clock generator means for transmitting said clock signal to a plurality of dual function pins;
providing latch memory input means coupled to said plurality of dual function pins and coupled to said latch memory for providing a frequency select code to be stored when said tri-state buffer means is in a high impedance state; and
providing clock output means coupled to said plurality of dual function pins for transmitting said clock signal throughout said computer system when said tri-state buffer means is in a low impedance state.

21. A method for making a frequency selectable clock synthesizer system for a computer comprising the step of providing a dual function pin coupled to the output of a tri-state buffer and to the input of a latch memory storing a frequency code defining a clock frequency of said system, said dual function pin functioning as a clock output pin when said tri-state buffer is in a low impedance state and said dual function pin functioning as a frequency code input pin when said tri-state buffer is in a high impedance state.

22. A method for making a frequency selectable clock synthesizer system for a computer comprising the steps of:
providing a sense input conductor coupled to the clock input of a latch memory module and to the input of a delay circuit;
providing a first plurality of conductors coupled from the outputs of said latch memory to the inputs of a frequency select logic module;
providing a second plurality of conductors coupled from the outputs of said frequency select logic module to the inputs of a phase locked loop clock generator module;
providing a first conductor coupled from the output of said phase locked loop clock generator module to the signal inputs of a plurality of tri-state output buffers;
providing a second conductor coupled from the output of said delay circuit to the control inputs of said plurality of tri-state output buffers;
providing a third plurality of conductors coupled from the signal outputs of said plurality of tri-state output buffers to a plurality of dual function pins; and
providing a fourth plurality of conductors coupled from said plurality of dual function pins to a plurality of data inputs of said latch memory module.

* * * * *